United States Patent
Joshi et al.

(10) Patent No.: US 9,222,169 B2
(45) Date of Patent: Dec. 29, 2015

(54) SILICON OXIDE-NITRIDE-CARBIDE THIN-FILM WITH EMBEDDED NANOCRYSTALLINE SEMICONDUCTOR PARTICLES

(75) Inventors: Pooran Chandra Joshi, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 1066 days.

(21) Appl. No.: 12/467,969

(22) Filed: May 18, 2009

(65) Prior Publication Data

US 2009/0217968 A1 Sep. 3, 2009

Related U.S. Application Data

(63) Continuation-in-part of application No. 11/418,273, filed on May 4, 2006, now Pat. No. 7,544,625, which is a continuation-in-part of application No. 11/327,612, filed on Jan. 6, 2006, now Pat. No. 7,723,242, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,318,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
| | |
|---|---|
| H01L 21/20 | (2006.01) |
| C23C 16/30 | (2006.01) |
| C23C 16/509 | (2006.01) |
| C23C 16/56 | (2006.01) |
| H01L 21/02 | (2006.01) |
| H01L 21/316 | (2006.01) |
| H01L 33/42 | (2010.01) |

(52) U.S. Cl.
CPC ............. *C23C 16/30* (2013.01); *C23C 16/5096* (2013.01); *C23C 16/56* (2013.01); *H01L 21/0234* (2013.01); *H01L 21/02126* (2013.01); *H01L 21/02274* (2013.01); *H01L 21/02321* (2013.01); *H01L 21/02337* (2013.01); *H01L 21/31608* (2013.01); *H01L 21/0262* (2013.01); *H01L 21/02532* (2013.01); *H01L 21/02601* (2013.01); *H01L 33/42* (2013.01)

(58) Field of Classification Search
USPC .................... 438/488; 257/E21.101; 977/773
See application file for complete search history.

(56) References Cited

U.S. PATENT DOCUMENTS

| | | | | |
|---|---|---|---|---|
| 5,599,403 A | * | 2/1997 | Kariya et al. | 136/258 |
| 5,851,600 A | * | 12/1998 | Horiike et al. | 427/535 |

(Continued)

FOREIGN PATENT DOCUMENTS

WO    WO2008/051235    5/2008

*Primary Examiner* — Kimberly Rizkallah
*Assistant Examiner* — Duy T Nguyen
(74) *Attorney, Agent, or Firm* — Law Office of Gerald Maliszewski; Gerald Maliszewski

(57) ABSTRACT

A solar call is provided along with a method for forming a semiconductor nanocrystalline silicon insulating thin-film with a tunable bandgap. The method provides a substrate and introduces a silicon (Si) source gas with at least one of the following source gases: germanium (Ge), oxygen, nitrogen, or carbon into a high density (HD) plasma-enhanced chemical vapor deposition (PECVD) process. A SiOxNyCz thin-film embedded with a nanocrystalline semiconductor material is deposited overlying the substrate, where x, y, z≥0, and the semiconductor material is Si, Ge, or a combination of Si and Ge. As a result, a bandgap is formed in the SiOxNyCz thin-film, in the range of about 1.9 to 3.0 electron volts (eV). Typically, the semiconductor nanoparticles have a size in a range of 1 to 20 nm.

22 Claims, 7 Drawing Sheets

(56) References Cited

U.S. PATENT DOCUMENTS

| | | | |
|---|---|---|---|
| 6,184,158 B1* | 2/2001 | Shufflebotham et al. | 438/788 |
| 6,710,366 B1 | 3/2004 | Lee et al. | |
| 7,446,023 B2* | 11/2008 | Joshi et al. | 438/475 |
| 2002/0135035 A1* | 9/2002 | Yamaguchi et al. | 257/440 |
| 2004/0079278 A1* | 4/2004 | Kamins et al. | 117/84 |
| 2004/0096593 A1* | 5/2004 | Lukas et al. | 427/558 |
| 2004/0125247 A1* | 7/2004 | Seshan et al. | 349/13 |
| 2004/0126582 A1 | 7/2004 | Ng et al. | |
| 2004/0132293 A1* | 7/2004 | Takayama et al. | 438/689 |
| 2005/0106858 A1* | 5/2005 | Cheng et al. | 438/643 |
| 2005/0158978 A1* | 7/2005 | Bohr | 438/612 |
| 2007/0099359 A1 | 5/2007 | Klimov et al. | |
| 2007/0111324 A1 | 5/2007 | Nie et al. | |
| 2007/0155137 A1* | 7/2007 | Joshi et al. | 438/478 |
| 2007/0298160 A1 | 12/2007 | Jang et al. | |
| 2008/0017242 A1 | 1/2008 | Sinha et al. | |
| 2008/0178794 A1 | 7/2008 | Cho et al. | |
| 2009/0263647 A1* | 10/2009 | Gangopadhyay et al. | 428/335 |
| 2012/0104385 A1* | 5/2012 | Godo et al. | 257/43 |

* cited by examiner

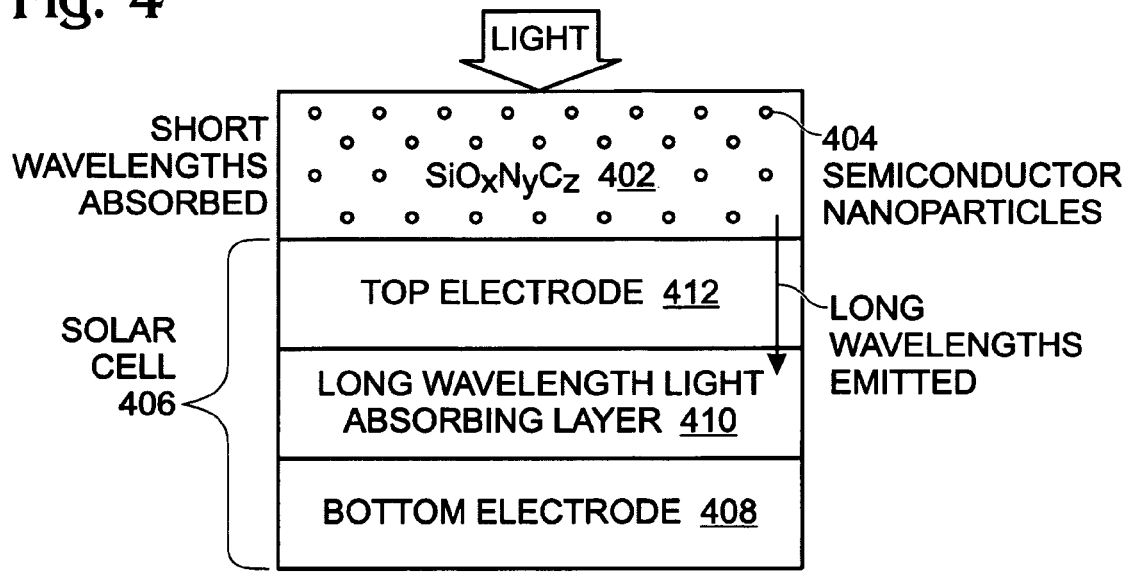
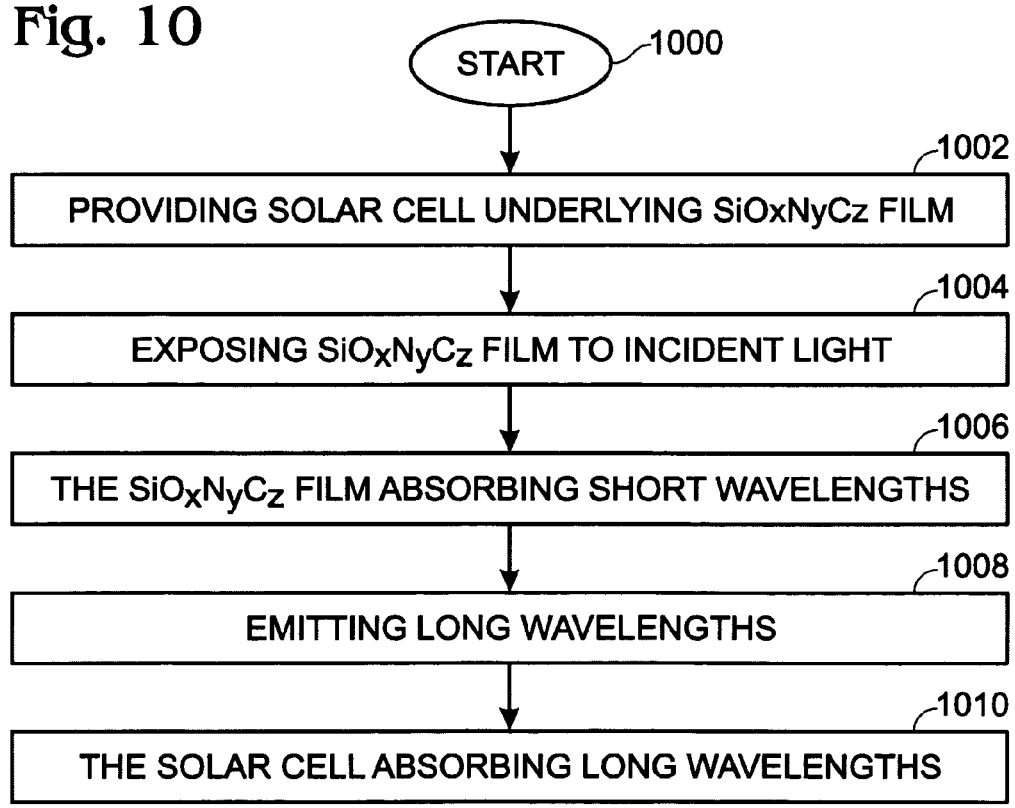

US 9,222,169 B2

SILICON OXIDE-NITRIDE-CARBIDE THIN-FILM WITH EMBEDDED NANOCRYSTALLINE SEMICONDUCTOR PARTICLES

RELATED APPLICATIONS

This application is a continuation-in-part of a patent application entitled, SILICON OXIDE THIN-FILMS WITH EMBEDDED NANOCRYSTALLINE SILICON, invented by Pooran Joshi et al., Ser. No. 11/418,273, filed May 4, 2006, now U.S. Pat. No. 7,544,625 which is a continuation-in-part of the following patent applications:

ENHANCED THIN-FILM OXIDATION PROCESS, invented by Pooran Joshi et al., Ser. No. 11/327,612, filed Jan. 6, 2006, now U.S. Pat. No. 7,723,242;

HIGH-DENSITY PLASMA HYDROGENATION, invented by Pooran Joshi et al., Ser. No. 11/013,605, filed Dec. 15, 2004, issued as U.S. Pat. No. 7,446,023;

DEPOSITION OXIDE WITH IMPROVED OXYGEN BONDING, invented by Pooran Joshi, Ser. No. 10/801,377, filed Mar. 15, 2004, issued as U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005, issued as U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004, issued as U.S. Pat. No. 7,186,663;

METHOD FOR FABRICATING OXIDE THIN-FILMS, invented by Joshi et al., Ser. No. 10/801,374, filed Mar. 15, 2004, issued as U.S. Pat. No. 7,087,537.

All of the above-mentioned applications are incorporated herein by reference.

BACKGROUND OF THE INVENTION

1. Field of the Invention

This invention generally relates to the fabrication of integrated circuit (IC) devices, and more particularly, to a solar cell and associated fabrication method for forming a silicon oxide-nitride-carbide (SiOxNyCz) thin film with embedded nanocrystalline semiconductor particles, using a high-density plasma-enhanced chemical vapor deposition process.

2. Description of the Related Art

The unique structural, electrical, and optical properties of nanocrystalline silicon (Si) have attracted interest for their use in optoelectronic and integrated memory devices. Silicon is the material of choice for the fabrication of optoelectronic devices because of well-developed processing technology. However, the indirect band-gap makes it an inefficient material for optoelectronic devices. Over the years, various R&D efforts have focused on tailoring the optical function of Si to realize Si-based optoelectronics. The achievement of efficient room temperature light emission from the crystalline silicon is a major step towards the achievement of fully Si-based optoelectronics.

The fabrication of stable and reliable optoelectronic devices requires Si nanocrystals with high photoluminescence (PL) and electroluminescence (EL) quantum efficiency. One approach that is being actively pursued for integrated optoelectronic devices is the fabrication of $SiO_x$ ($x \leq 2$) thin films with embedded Si nanocrystals. The luminescence due to recombination of the electron-hole pairs confined in Si nanocrystals depends strongly on the nanocrystal size. The electrical and optical properties of the nanocrystalline Si embedded $SiO_x$ thin films depend on the size, concentration, and distribution of the Si nanocrystals. Various thin-film deposition techniques such as sputtering and plasma-enhanced chemical vapor deposition (PECVD), employing capacitively-coupled plasma source, are being investigated for the fabrication of stable and reliable nanocrystalline Si thin films.

However, conventional PECVD and sputtering techniques have the limitations of low plasma density, inefficient power coupling to the plasma, low ion/neutral ratio, and uncontrolled bulk, and interface damage due to high ion bombardment energy. Therefore, the oxide films formed from a conventional capacitively-coupled plasma (CCP) generated plasma may create reliability issues due to the high bombardment energy of the impinging ionic species. It is important to control or minimize any plasma-induced bulk or interface damage. However, it is not possible to control the ion energy using radio frequency (RF) of CCP generated plasma. Any attempt to enhance the reaction kinetics by increasing the applied power results in increased bombardment of the deposited film, which creates a poor quality films with a high defect concentration. Additionally, the low plasma density associated with these types of sources ($\sim 1 \times 10^8$-$10^9$ cm$^{-3}$) leads to limited reaction possibilities in the plasma and on the film surface, inefficient generation of active radicals for enhanced process kinetics, inefficient oxidation, and reduction of impurities at low thermal budgets, which limits their usefulness in the fabrication of low-temperature electronic devices.

A deposition process that offers a more extended processing range and enhanced plasma characteristics than conventional plasma-based techniques, such as sputtering, PECVD, etc., is required to generate and control the particle size for PL/EL based device development. A process that can enhance plasma density and minimize plasma bombardment will ensure the growth of high quality films without plasma-induced microstructural damage. A process that can offer the possibility of controlling the interface and bulk quality of the films independently will enable the fabrication of high performance and high reliability electronic devices. A plasma process that can efficiently generate the active plasma species, radicals and ions, will enable noble thin film development with controlled process and property control.

For the fabrication of high quality silicon based films, the oxidation of the grown film is also critical. A process that can generate active oxygen radicals at high concentration will ensure effective passivation of the Si nanoparticles in the oxide matrix surrounding it. A plasma process that can minimize plasma-induced damage will enable the formation of a high quality interface that is critical for the fabrication of high quality devices. Low thermal budget efficient oxidation and hydrogenation processes are critical and will be significant for the processing of high quality optoelectronic devices. The higher temperature thermal processes can interfere with the other device layers and it is not suitable in terms of efficiency and thermal budget, due to the lower reactivity of the thermally activated species. Additionally, a plasma process which can provide a more complete solution and capability in terms of growth/deposition of novel film structures, oxidation, hydrogenation, particle size creation and control, and independent control of plasma density and ion energy, and large area processing is desired for the development of high performance optoelectronic devices. Also, it is important to correlate the plasma process with the thin film properties as the various plasma parameters dictate the thin film properties and the desired film quality depends on the target application. Some of the key plasma and thin-film characteristics that depend on the target application are deposition rate, temperature, thermal budget, density, microstructure, interface quality, impurities, plasma-induced damage, state of the plasma generated active species (radicals/ions), plasma potential, process and system scaling, and electrical quality and reliability. A correlation among these parameters is critical to evaluate the film quality as the process map will dictate the film quality for the target application. It may not be possible to learn or develop thin-films by just extending the processes developed in low density plasma or other high density plasma systems, as the plasma energy, composition (radical to ions), plasma potential, electron temperature, and thermal conditions correlate differently depending on the process map.

Low temperatures are generally desirable in liquid crystal display (LCD) manufacture, where large-scale devices are formed on transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

The performance of the bulk or thin film Si solar cells strongly depends of the intrinsic properties of the constituent layers and the interfacial characteristics of the integrated structure. Some of the key parameters defining the solar cell efficiency are the absorption of the solar spectrum, light coupling into cell, carrier generation/recombination and transport across various interfaces, stability, and reliability. The optical bandgap is one of the key material properties that determines the absorption of the incident light and transport of the carrier across the interfaces in integrated devices. Extensive research is being conducted to find a suitable window material for thin film or bulk Si cells exhibiting wide bandgap, high electrical conductivity, and good interfacial characteristics. One of the key focus areas is the development of single layers serving the dual role of window and electrical contacts in thin films or as emitter in bulk Si solar cells. Typically, the optical properties of the materials are not tunable over a wide range without sacrificing the balance among the various desired properties for a particular application. Generally, a complete solution requires the use of multilayer structures involving different material systems to accomplish the desired device performance.

It would be advantageous if a low-temperature process existed for the fabrication of silicon based thin-films with embedded semiconductor nanocrystals, to be used in solar cells as a photon absorbing layer, window layer, and electrode layer.

SUMMARY OF THE INVENTION

Described herein is the fabrication and characteristics of nanocrystalline silicon (nc-Si) or nc-Ge (germanium) embedded silicon oxide-nitride-carbide (SiOxNyCz) thin films with a tunable optical bandgap in the range of 1.9-3.0 electron volts (eV). The lower limit of the bandgap exceeds the value of 1.7-1.8 eV achievable with a-Si thin films. Either intrinsic or doped ncSi/nc-Ge embedded SiOxNyCz thin films can be bandgap tuned for use as a window layer or electrical contact in thin film solar cells. The SiOxNyCz thin films can also be used as an emitter in bulk Si based heterojunction solar cells, due to better bandgap alignment at the junctions and smoother interfaces. In addition, the nc-Si and nc-Ge particles (1-20 nm) offer further enhancement in the optical absorption and wavelength conversion in the ultra violet-visible-infrared (UV-VIS-IR) ranges for the fabrication of high performance solar cells.

The SiOxNyCz thin films are fabricated using a high-density plasma-based process characterized by high plasma concentrations, low plasma potential, and independent control of plasma energy and density, which provide unique process possibilities and control. The high-density plasma characteristics are a result of enhanced plasma reaction kinetics. The high-density plasma deposition process is dominantly controlled by the plasma characteristics rather than the thermal state of the substrate. The high plasma density and low plasma potential of the high-density plasma process are attractive for the creation of the Si or Ge nanocrystals, while minimizing the plasma induced bulk and interface damage. The high-density plasma process is suitable for the fabrication of single layer, bilayer, or multilayer structures for optoelectronic applications by sequential processing, either in-situ or using a cluster tool.

Accordingly, a method is provided for forming a semiconductor nanocrystalline silicon insulating thin-film with a tunable bandgap. The method provides a substrate and introduces a Si source gas with at least one of the following source gases: Ge, oxygen, nitrogen, or carbon into a high density (HD) plasma-enhanced chemical vapor deposition (PECVD) process. A SiOxNyCz thin-film embedded with a nanocrystalline semiconductor material is deposited overlying the substrate, where x, y, z≥0, and the semiconductor material is Si, Ge, or a combination of Si and Ge. As a result, a bandgap is formed in the SiOxNyCz thin-film, in the range of about 1.9 to 3.0 electron volts (eV).

Typically, the semiconductor nanoparticles have a size in a range of 1 to 20 nm. In one aspect, the SiOxNyCz thin film is annealed at a temperature of greater than about 400° C., and as a result, the size of the semiconductor nanoparticles is modified. In another aspect, an HD plasma treatment is performed on the SiOxNyCz thin film in an $H_2$ atmosphere, using a substrate temperature of less than 400° C., to hydrogenate the SiOxNyCz thin film.

Additional details of the above-described method, a solar cell, and a solar cell wavelength conversion device are presented below.

BRIEF DESCRIPTION OF THE DRAWINGS

FIG. 4 is a partial cross-sectional view of a solar cell light wavelength conversion device.

FIG. 10 is a flowchart illustrating a method for solar cell light wavelength conversion.

DETAILED DESCRIPTION

Figure 1:
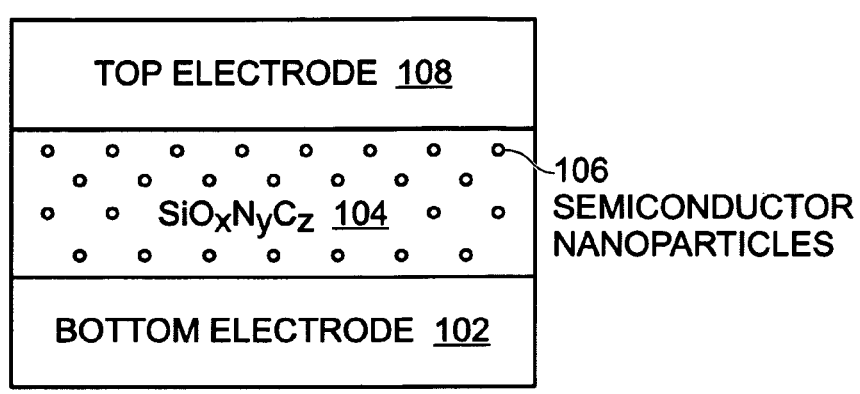
FIG. 1 is a partial cross-sectional view of a solar cell.

FIG. 1 is a partial cross-sectional view of a solar cell. The solar cell 100 comprises a bottom electrode 102 doped with either an n-type or p-type dopant. A SiOxNyCz thin film 104 overlies the bottom electrode 102, where x, y, z≥0. The SiOxNyCz thin film 104 has a bandgap in the range of about 1.9 to 3.0, and is embedded with semiconductor nanoparticles 106, which may be Si, Ge, or a combination of Si and Ge. In one aspect, the semiconductor nanoparticles 106 have a size in the range of 1 to 20 nanometers (nm). A doped top electrode 108 overlies the SiOxNyCz thin film 104. If the bottom electrode 102 is n-doped, the top electrode 108 is p-doped. Alternately, if the bottom electrode 102 is p-doped, the top electrode 108 is n-doped.

In one aspect, the SiOxNyCz thin film 104 is either a doped or an intrinsic material. For example, the SiOxNyCz thin film 104 may be embedded with a dopant such as a Type 3, Type 4, Type 5, or rare earth elements. The use of such a dopant may act to shift optical absorption characteristics from deep ultraviolet (UV) to far infrared (IR). In another aspect, the top electrode 108 and bottom electrode 102 are a doped (n or p-type) SiOxNyCz material. Advantageously, the use of a single material permits the solar cell to be made in-situ, in a single process.

Figure 2C:
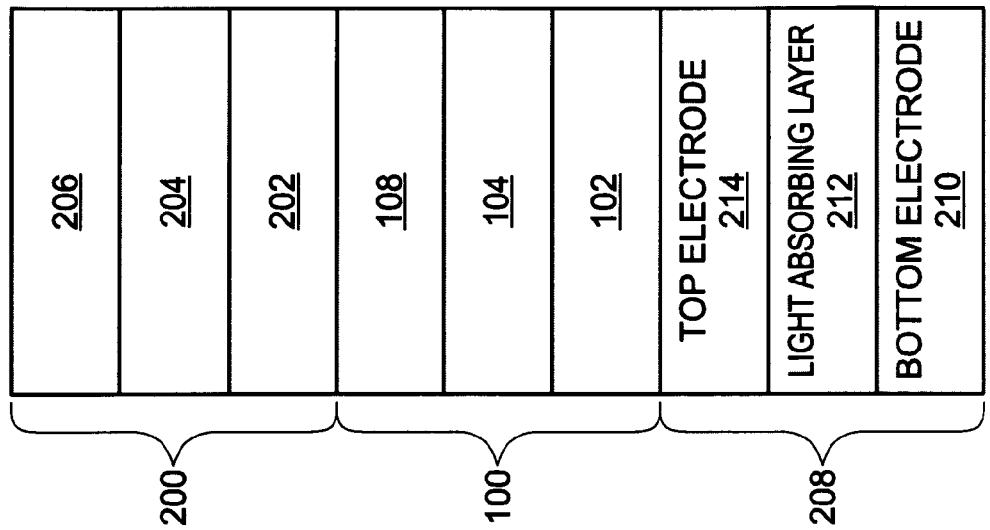
FIGS. 2A through 2C are partial cross-sectional views depicting the addition of a second solar cell.
Figure 2B:
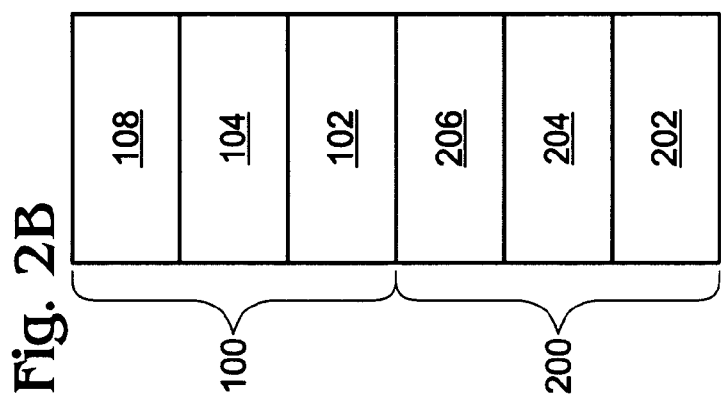
Figure 2A:
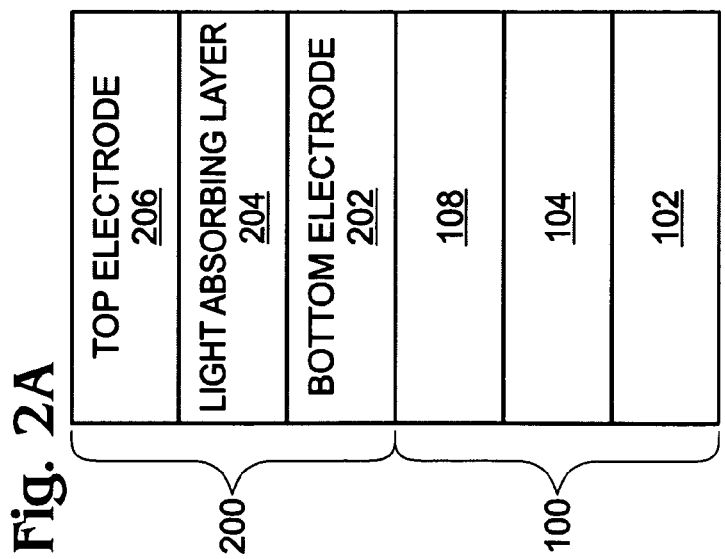

FIGS. 2A through 2C are partial cross-sectional views depicting the addition of a second solar cell. In FIG. 2A, the second solar cell 200 overlies the (first) solar cell 100. In FIG. 2B, the second solar cell 200 underlies solar cell 100. In FIG. 2C, a second cell overlies solar cell 100 and a third solar cell 208 underlies solar cell 100. In any of these cases, the second solar cell 200 comprises a bottom electrode 202 doped with either an n-type or p-type dopant. A light absorbing layer 204 overlies the bottom electrode 202, and a top electrode 206 overlies the light absorbing layer 204. If the bottom electrode 202 is n-doped, the top electrode 206 is p-doped. Alternately, if the bottom electrode 202 is p-doped, the top electrode 206 is n-doped.

Likewise, the third solar cell 208 comprises a bottom electrode 210 doped with either an n-type or p-type dopant. A light absorbing layer 212 overlies the bottom electrode 210, and a top electrode 214 overlies the light absorbing layer 212. If the bottom electrode 210 is n-doped, the top electrode 214 is p-doped. Alternately, if the bottom electrode 210 is p-doped, the top electrode 214 is n-doped. In one aspect, the second solar cell 200 light absorbing layer 204, top electrode 206, and bottom electrode 202 are a SiOxNyCz material. In another aspect, the third solar cell 208 light absorbing layer 212, top electrode 214, and bottom electrode 210 are a SiOxNyCz material. In a third aspect, both the second and third solar cell 200/208 light absorbing layers 204/212, top electrodes 206/214, and bottom electrodes 202/210 are a SiOxNyCz material.

Figure 3:
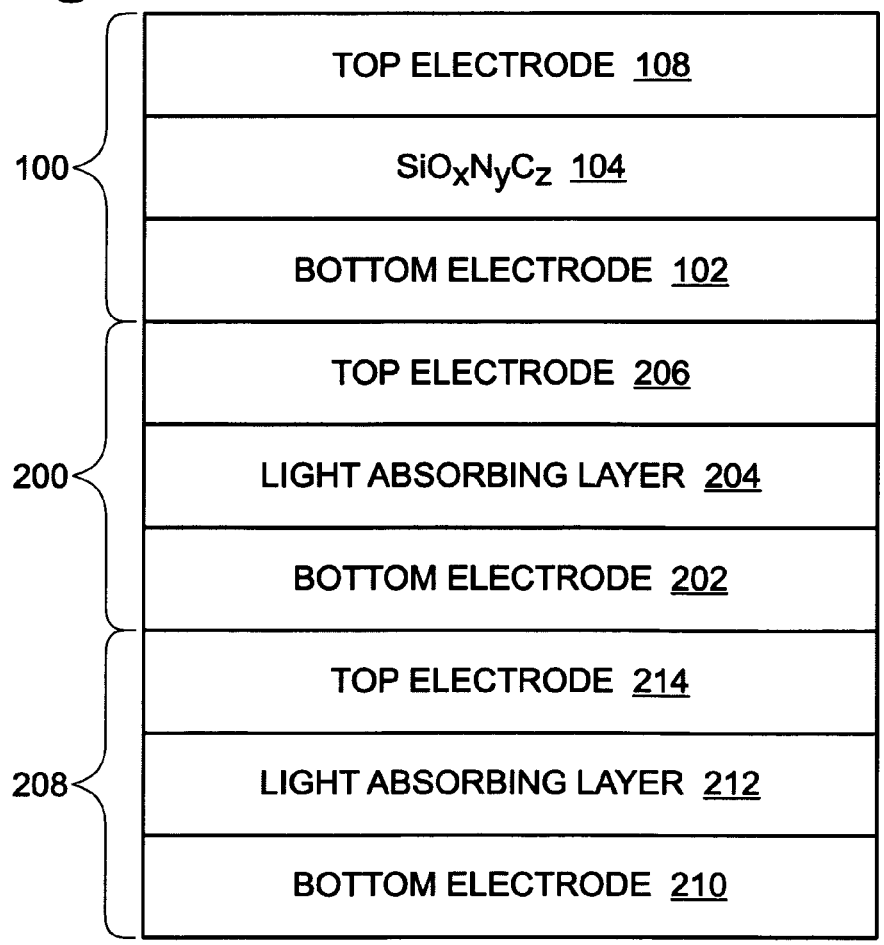
FIG. 3 is a partial cross sectional view depicting another variation of a multi-cell solar cell.

FIG. 3 is a partial cross sectional view depicting another variation of a multi-cell solar cell. In this aspect, the second solar cell 200 underlies the first solar cell 100, and the third solar cell 208 underlies the second solar cell 200. The first solar cell SiOxNyCz thin film 104 has a first bandgap. As noted above, the first bandgap range is 1.9 to 3 eV. The second solar cell intrinsic layer 204 has a second bandgap, less than 1.9 eV, and the third solar cell intrinsic layer 212 has a third bandgap, less than the second bandgap. In this aspect, the second and third solar cell electrodes 202, 206, 210, and 214 may be a SiOxNyCz material.

FIG. 4 is a partial cross-sectional view of a solar cell light wavelength conversion device. The device 400 comprises a SiOxNyCz thin film 402 where x, y, z≥0, with a bandgap in a range of about 1.9 to 3 eV. The SiOxNyCz thin 402 is embedded with semiconductor nanoparticles 404, where the semiconductor material is Si, Ge, or a combination of Si and Ge. The SiOxNyCz thin film 402 absorbs "short" wavelengths of incident light, shorter than about 500 nm, and in response to absorbing the light wavelengths, emits "long" wavelengths of light, longer than about 500 nm.

A solar cell 406 underlies the SiOxNyCz thin film 402. The solar cell 406 comprises a bottom electrode 408 doped with either an n-type or p-type dopant. A long wavelength light absorbing layer 410 overlies the bottom electrode 408. The long wavelength light absorbing layer 410 absorbs wavelengths of light longer than 500 nm. A top electrode 412 overlies the long wavelength light absorbing layer 410. If the bottom electrode 408 is n-doped, the top electrode 412 is p-doped. Alternately, if the bottom electrode 408 is p-doped, the top electrode 412 is n-doped.

Generally, the above-described SiOxNyCz thin film can be used for light absorption, a window layer (to pass particular ranges of wavelengths), a bandgap alignment layer, an electrical contact: either p- and n type, an emitter layer of heterojunction cells, a passivation layer, or a wavelength conversion layer.

High-Density Plasma System

Figure 5:
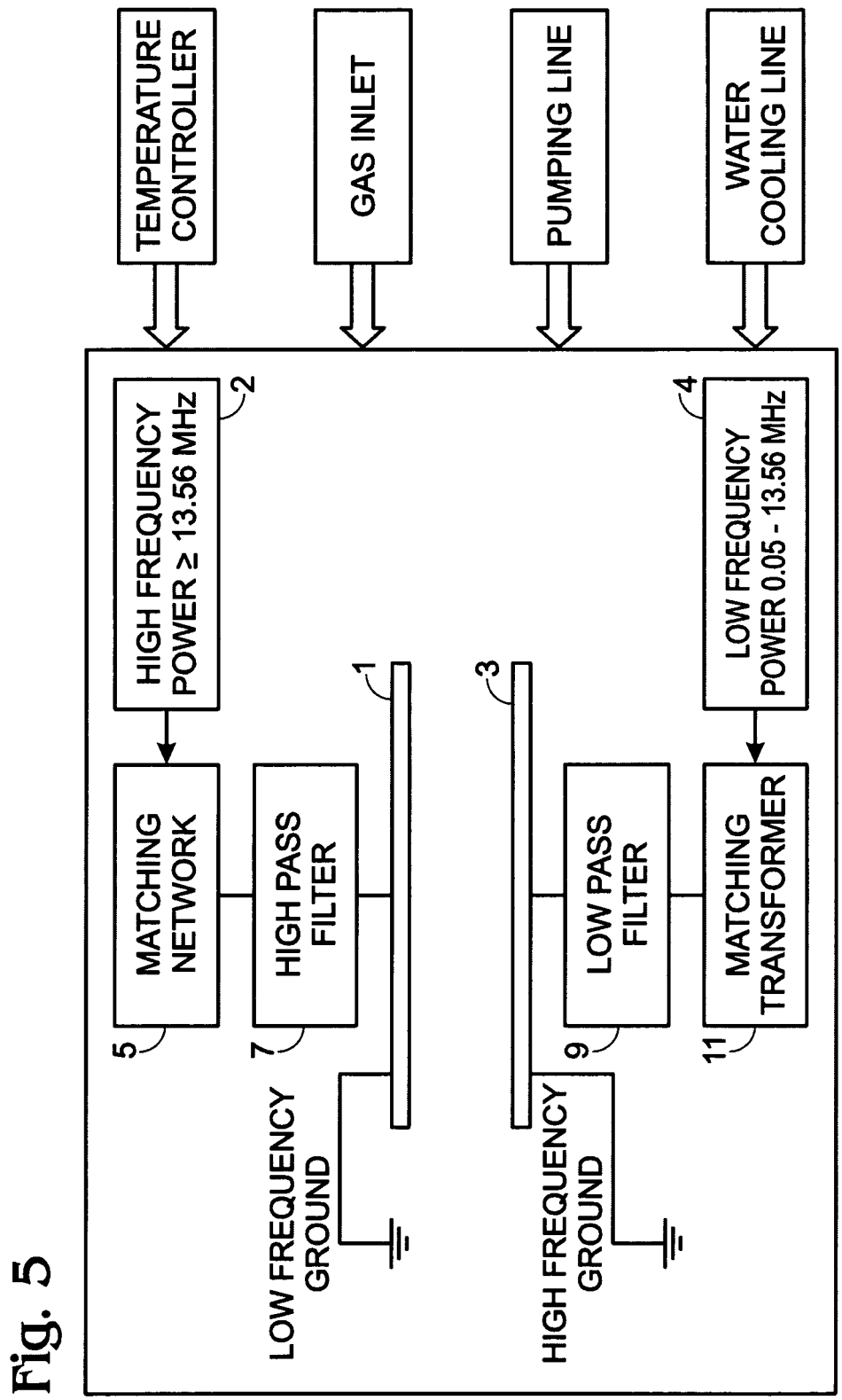
FIG. 5 is a schematic drawing of a high-density plasma (HDP) system with an inductively-coupled plasma source.

FIG. 5 is a schematic drawing of a high-density plasma (HDP) system with an inductively coupled plasma source. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter (W/cm$^2$), while the bottom electrode power can be as great as about 3 W/cm$^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than $1\times10^{11}$ cm$^{-3}$, and the electron temperature is less than 10 eV. There is no need to maintain a bias differential between the capacitor connected to the top electrode and the system body, as in many high density plasma systems and conventional designs such as capacitively-coupled plasma tools. Alternately stated, both the top and bottom electrodes receive RF and low frequency (LF) powers.

Figure 6:
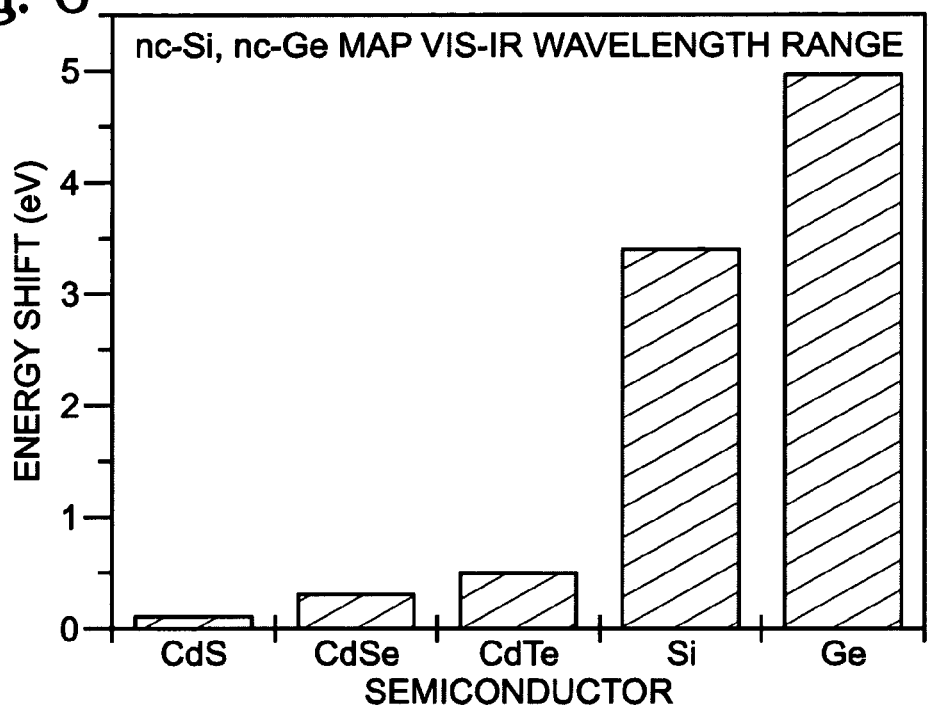
FIG. 6 is a graph depicting the energy shifts associated with nanocrystalline particles.

FIG. 6 is a graph depicting the energy shifts associated with nanocrystalline particles. As shown, Si and Ge nanoparticles offer the largest energy shift as compared to other quantum dots (QDs).

Figure 7:
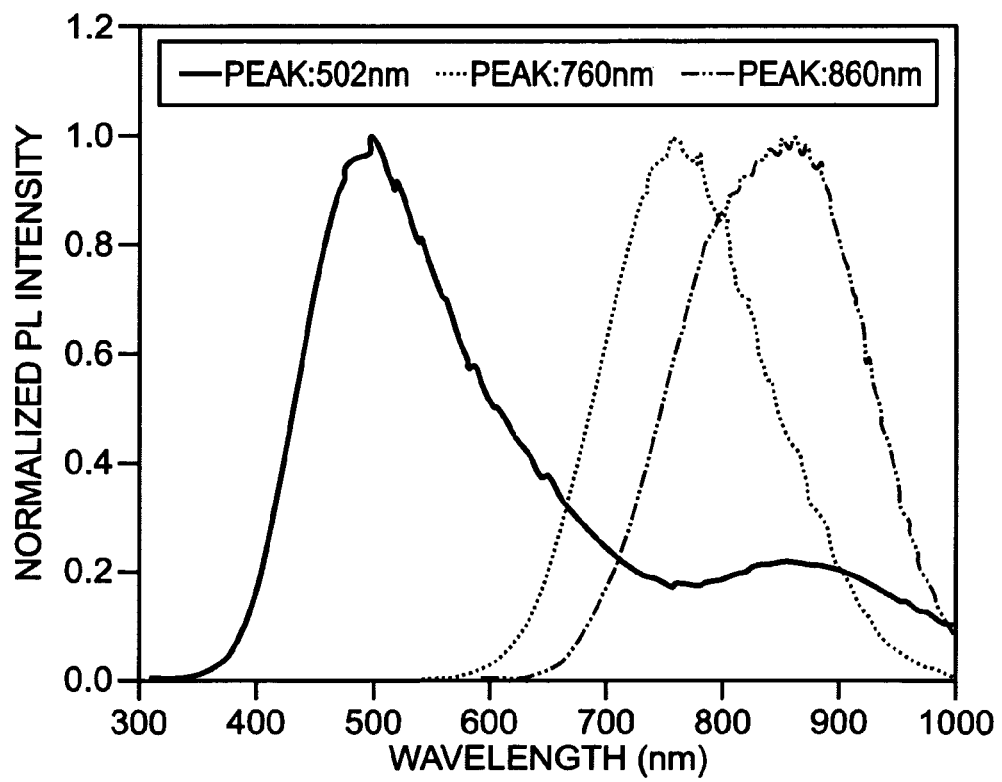
FIG. 7 is a graph depicting the relationship between PL intensity, wavelength, and particle size.

FIG. 7 is a graph depicting the relationship between PL intensity, wavelength, and particle size. The optical response of the nc-Si and nc-Ge nanoparticles covers the UV-VIS-IR portion of the solar spectrum. The PL response depends on the nc-Si size and red shifts with an increase in size. The optical response of nc-Ge and nc-Si particles (1-20 nm), in combination with the optical dispersion and bandgap of the composite SiO, N, C matrix, are attractive for the development of high performance solar cells.

Figure 8A:
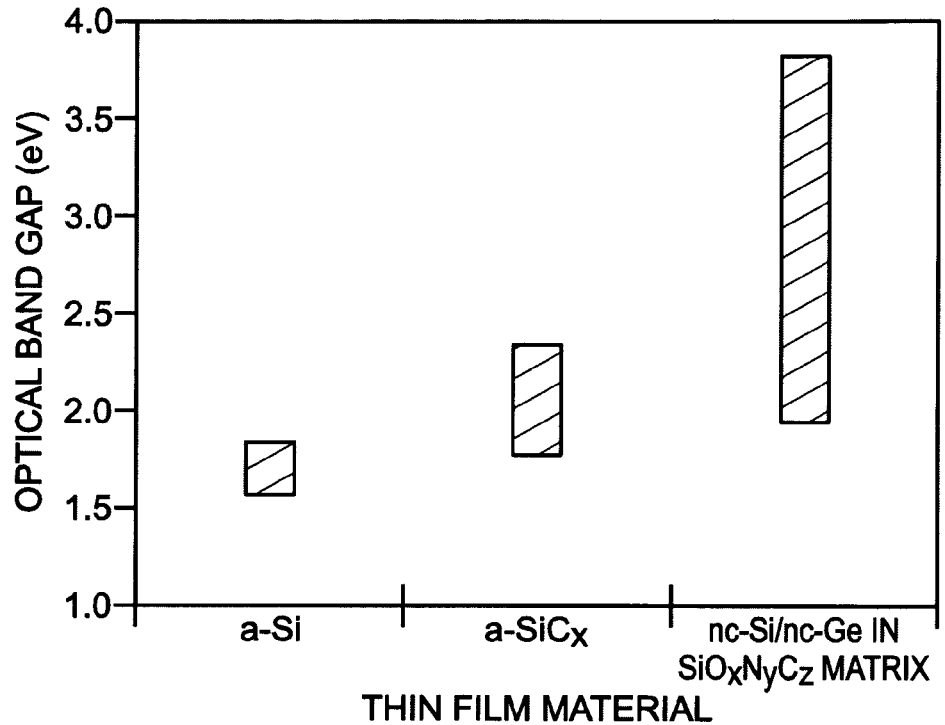
FIG. 8A is a graph depicting the relationship between bandgap and materials.

FIG. 8A is a graph depicting the relationship between bandgap and materials.

Figure 8B:
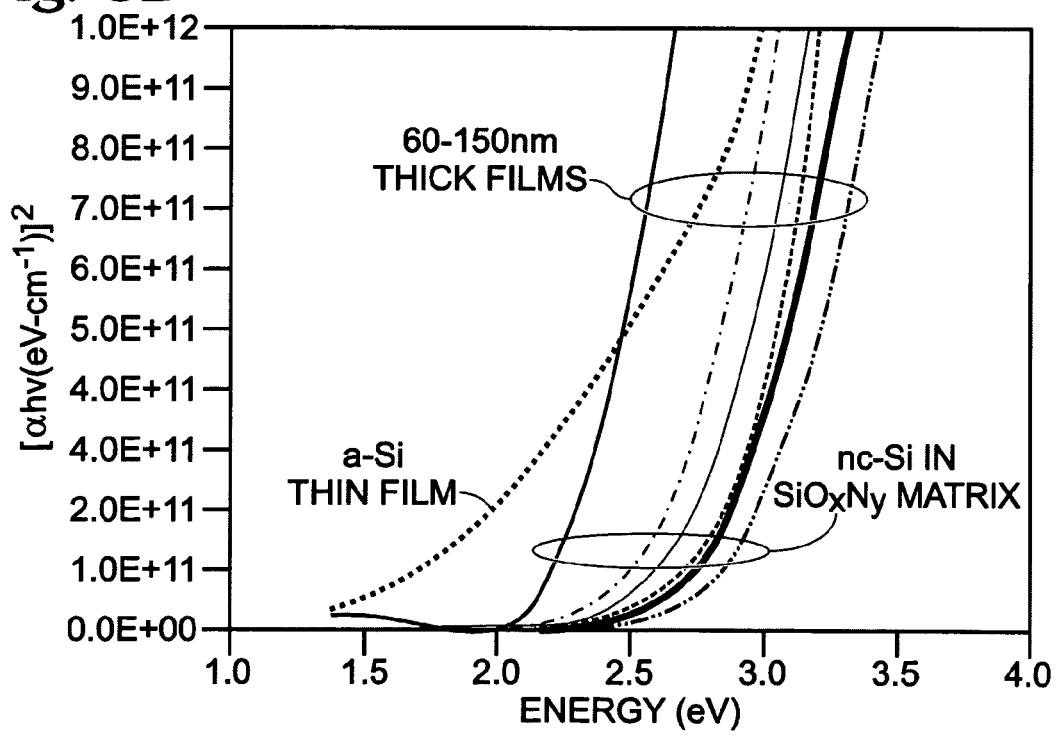
FIG. 8B is a graph depicting a range of bandgaps tuned as a result of HE-PECVD processing.

FIG. 8B is a graph depicting a range of bandgaps tuned as a result of HE-PECVD processing. The optical bandgap of nc-Si/nc-Ge embedded SiOxNyCz thin films is relatively large, when compared to other materials conventionally used in solar applications. Since the optical bandgap of the nc-Si/nc-Ge embedded thin films is tunable over a much wider range, the nc-Si/nc-Ge particles offer enhanced control over optical absorption wavelengths and wavelength conversion in the UV-VIS-IR wavelength range. When doped for a selected bandgap and electrical conductivity, these films are suitable for both thin film and bulk Si solar cell applications—exploiting better bandgap alignment, interface control, and surface passivation characteristics.

The nc-Si/nc-Ge embedded SiOxNyCz thin films can be processed by HDP technique at process temperatures below 400° C. The HDP technique is suitable for the fabrication of high quality thin films with a dense microstructure, low impurity content, and minimal plasma induced device damage, which are factors in device performance, stability, and reliability. The HDP processed films can be deposited on any suitable substrate or as part of a multilayer structure for the exploiting the refractive index, bandgap, absorption coefficient, photoluminescence (PL), and electroluminescence (EL) emission characteristics of pure or doped films. Some of the substrates that are suitable for integrated optical devices are Si, Ge, glass, quartz, SiC, GaN, and $Si_xGe_{1-x}$. The HDP processed films can be doped in-situ by adding a dopant source gas or incorporating physical sputtering source in the chamber along with the high-density PECVD setup. The optical properties of the HDP processed films can also be modified by implanting dopant species. The typical process conditions for the fabrication of stoichiometric nc-Si and/or nc-Ge embedded SiOxNyCz thin films by HD-PECVD technique are listed in Table 1.

TABLE 1

High-density plasma deposition of nc-Si and/or nc-Ge embedded $SiO_xN_yC_z$ thin films.

| | |
|---|---|
| Top Electrode Power | 13.56-300 MHz, up to 10 W/cm², |
| Bottom Electrode Power | 50 KHz-13.56 MHz, up to 3 W/cm² |
| Pressure | 1-500 mTorr |
| Si/Ge source | Any suitable Si and Ge precursor ($SiH_4$, $Si_2H_6$, TEOS, $Ge_nH_{2n+2}$, etc.) |
| Oxygen Source | Any suitable source of oxygen: ($N_2O$, $O_2$, $O_3$, NO, etc.) |
| Nitrogen Source | Any suitable source of nitrogen ($NH_3$, $N_2$, etc.) Our case: $N_2$ |
| Carbon source | Any suitable hydrocarbon (alkanes ($C_nH_{2n+2}$), alkenes ($C_nH_{2n}$), alkynes ($C_nH_{2n-2}$), Benzene ($C_6H_6$), Toluene ($C_7H_8$), etc. |

TABLE 1-continued

High-density plasma deposition of nc-Si and/or nc-Ge embedded $SiO_xN_yC_z$ thin films.

| | |
|---|---|
| Inert Gases ion the plasma | Any suitable inert gas: Noble gases, $N_2$, etc. |
| Defect passivation | $H_2$ only, inert gases + $H_2$ hydrogen source ($NH_3$, $H_2$, etc.) |
| Temperature | 25-400° C. |

Hydrogenation

In general, the bulk and interface defect concentration of nc-Si/nc-Ge embedded SiOxNyCz thin films can be further reduced by hydrogen passivation of the defect sites for the fabrication of advanced optoelectronic devices with high quantum efficiency. The films can be hydrogenated by thermal and plasma methods. The films can be hydrogenated by thermal annealing in a $N_2/H_2$ atmosphere at any suitable annealing temperature. The thermal hydrogenation process typically requires a high thermal budget due to low diffusion coefficients of molecular hydrogen species at thermal energies.

The high-density plasma hydrogenation process is attractive for an efficient low temperature and low thermal budget passivation of defects and dangling bonds in the deposited thin films. High-density plasma-generated active hydrogen species are suitable for the efficient hydrogenation of thick films and novel multilayer structures. Table 2 summarizes the high-density plasma processing conditions suitable for the efficient hydrogenation of thin films. Details of such a process are provided in the patent application entitled, HIGH-DENSITY PLASMA HYDROGENATION, invented by Pooran Joshi et al., Ser. No. 11/013,605, filed Dec. 15, 2004, which is incorporated herein by reference.

TABLE 2

High density plasma hydrogenation process range

| | |
|---|---|
| Top Electrode Power | 13.56-300 MHz, up to 10 W/cm², |
| Bottom Electrode Power | 50 KHz-13.56 MHz, up to 3 W/cm² |
| Pressure | 1-500 mTorr |
| Gases: General | $H_2$ + Any suitable Inert Gas |
| Exemplary Gases | $H_2$ |
| Temperature | 25-400° C. |
| Time | 30 s-60 min |

Thermal Treatment and PL Emission

High-temperature annealing results in a separation of the nanocrystals from the matrix of SiOxNyCz. The annealing temperature and time can be varied with the thin-film deposition process conditions and properties, so that the nanoparticle cluster size, concentration, and distribution are varied. Some exemplary annealing conditions are listed in Table 3.

TABLE 3

| | |
|---|---|
| Temperature Range | >400° C. |
| Time | 10-60 min |
| Ambient | Inert gas/Oxygen |

Figure 9:
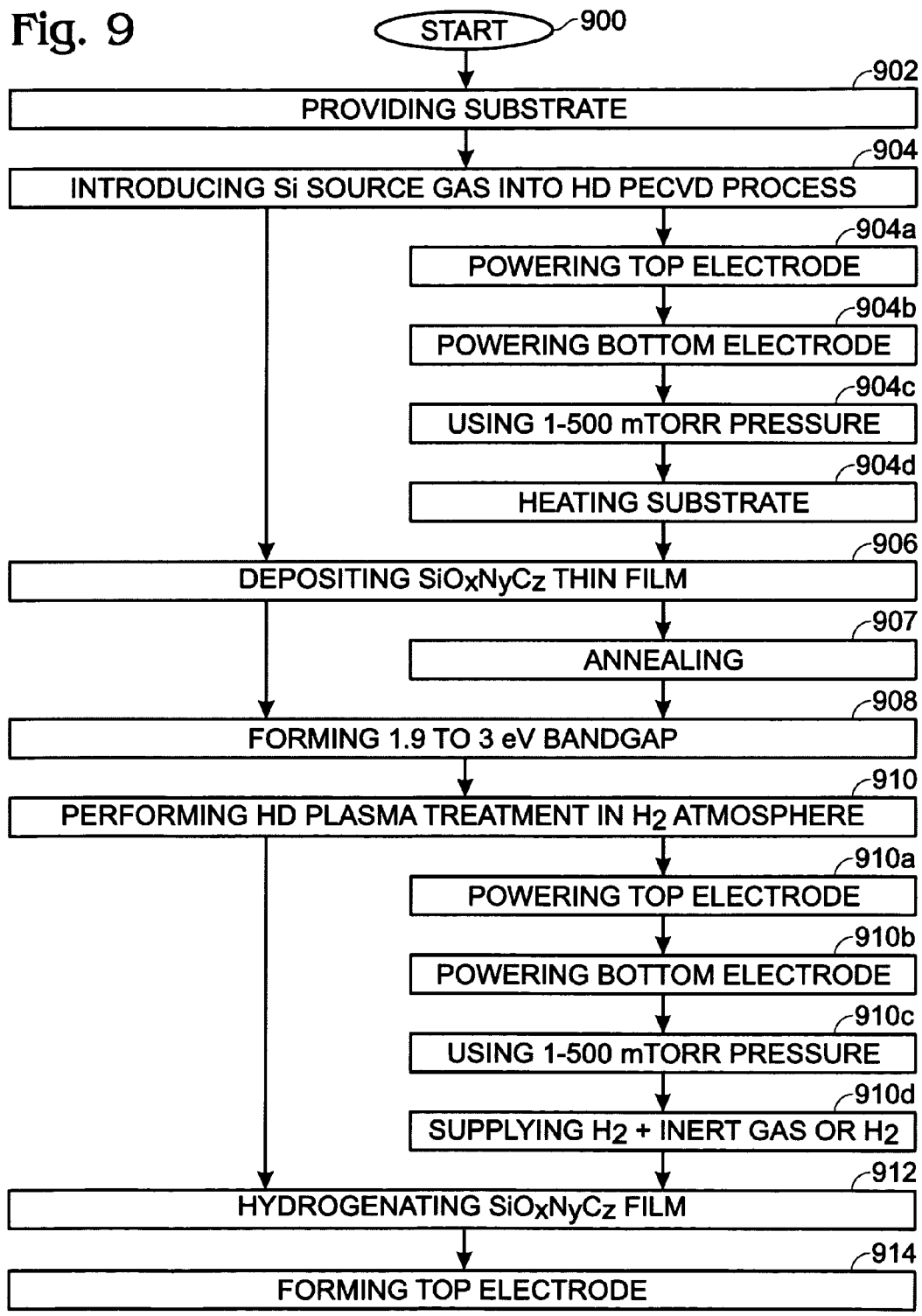
FIG. 9 is a flowchart illustrating a method for forming a semiconductor nanocrystalline silicon insulating thin-film with a tunable bandgap.

FIG. 9 is a flowchart illustrating a method for forming a semiconductor nanocrystalline silicon insulating thin-film with a tunable bandgap. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a substrate such as plastic, glass, quartz, Si, SiC, GaN, Ge, or $Si_{1-x}Ge_x$. Step 904 introduces a Si source gas into a high density HD PECVD process, with at least one of the following source gases: Ge, oxygen, nitrogen, or carbon. The HD PECVD process energy source may be a microwave slot antenna, ICP, a hollow cathode, an electron cyclotron resonance (ECR) plasma source, an inductively-coupled plasma source, or a cathode-coupled plasma source. Note: the HD PECVD plasma concentration is greater than $1 \times 10^{11}$ $cm^{-1}$, with an electron temperature of less than 10 eV.

Step 906 deposits a SiOxNyCz thin-film embedded with a nanocrystalline semiconductor material overlying the substrate, where x, y, z≥0. Thus, the deposited film may be SiOxNy, SiCx, SiOxCy, SiOx, or SiNx. The semiconductor material is Si, Ge, or a combination of Si and Ge. Step 908 forms a bandgap in the SiOxNyCz thin-film, in the range of about 1.9 to 3.0 electron volts (eV).

In one aspect, Step 908 forms semiconductor nanoparticles having a size in the range of 1 to 20 nm. Typically, the SiOxNyCz thin-film has a refractive index in the range of about 1.9 to 3.5, as measured at a wavelength of 632 nm, with peak optical emission, transmission, and absorption characteristics at a wavelength in the range of 200 to 1600 nm.

In one aspect, introducing the Si source gas into an HD PECVD process in Step 904 includes using an inductively coupled plasma (ICP) process with the following substeps. Step 904a supplies power to a top electrode at a frequency in the range of 13.56 to 300 megahertz (MHz), and a power density of up to 10 watts per square centimeter ($W/cm^2$). Step 904b supplies power to a bottom electrode at a frequency in the range of 50 kilohertz to 13.56 MHz, and a power density of up to 3 $W/cm^2$. Step 904c uses an atmosphere pressure in the range of 1 to 500 mTorr.

If an oxygen source gas is used in Step 904, it may be $N_2O$, NO, $O_2$, or $O_3$. Nitrogen source gases include $N_2$ and $NH_3$. Carbon source gases include alkanes ($C_nH_{2n+2}$), alkenes ($C_nH_{2n}$), alkynes ($C_nH_{2n-2}$), benzene ($C_6H_6$), and toluene ($C_7H_8$). Ge source gases include $Ge_nH_{2n+2}$, where n varies from 1 to 4, and $GeH_xR_{4-x}$, where R is Cl, Br, or I, and where x varies from 0 to 3. Si source gases include SiH4, Si2H6, TEOS (tetra-ethoxy ortho-silicate), $Si_nH2_{n+2}$, where n varies from 1 to 4, and $SiH_xR_{4-x}$ where R is Cl, Br, or I, and where x varies from 0 to 3. In one aspect, Step 904 further supplies an inert gas such as He, Ar, and Kr. Simultaneous with the HD PECVD process, Step 904d typically heats the substrate to a temperature in a range of about 25 to 400° C.

In one aspect, Step 907 anneals the SiOxNyCz thin film as follows: heating an underlying substrate to a temperature of greater than about 400° C.; heating for a time duration in the range of about 10 to 300 minutes; heating in an atmosphere of oxygen and hydrogen, oxygen, hydrogen, or inert gases. Then, forming the bandgap in the SiOxNyCz thin film (Step 908) includes modifying the size of the semiconductor nanoparticles in response to the annealing. In one aspect, Step 907 uses either flash (lamp source) annealing or laser annealing, with a heat source having a radiation wavelength of about 150 to 600 nm or 9 to 11 micrometers.

In another aspect, Step 910 performs a HD plasma treatment on the SiOxNyCz thin film in an $H_2$ atmosphere, using a substrate temperature of less than 400° C., and Step 912 hydrogenates the SiOxNyCz thin film. The hydrogenating of Step 910 may include the following substeps. Step 910a supplies power to a top electrode at a frequency in the range of 13.56 to 300 MHz, and a power density of up to 10 $W/cm^2$. Step 910b supplies power to a bottom electrode at a frequency in the range of 50 kilohertz to 13.56 MHz, and a power density of up to 3 $W/cm^2$. Step 910c uses an atmosphere pressure in the range of 1 to 500 mTorr, and Step 910d supplies an atmosphere selected from of $H_2$ and an inert gas, or $H_2$.

In one aspect, forming the bandgap in the SiOxNyCz thin film in Step 908 includes forming either an intrinsic (pure) or doped SiOxNyCz thin film. If doped, the SiOxNyCz thin film may be doped in-situ doping during the HD PECVD process using dopant source gas or a physical sputtering source. The SiOxNyCz thin film may be doped with a dopant such as a Type 3, Type 4, Type 5, or rare earth elements.

In another aspect, providing the substrate in Step 902 includes forming a bottom electrode doped with either an n-type or p-type dopants. Forming the bandgap in the SiOxNyCz thin film (Step 908) includes forming either a doped or intrinsic SiOxNyCz thin film. Then, Step 914 forms a top electrode overlying the SiOxNyCz thin film. If the bottom electrode is n-doped, the top electrode is p-doped. Alternately, if the bottom electrode is p-doped, the top electrode is n-doped. In one aspect, the top and bottom electrodes formed in Steps 914 and 902, respectively are formed in-situ from the SiOxNyCz thin film.

The high-density plasma is efficient in the generation of active radical and ionized species. The metastables of inert gas atoms, generated in the plasma, have high energy, depending on the nature of the inert gas and the partial pressure of various precursor and gases. The high energy is transferred to the reactive species in the plasma for enhanced reaction kinetics in the fabrication of high quality thin films. For example, the metastables of inert gas like He can effectively generate radicals or ions by energy transfer in the plasma to promote the creation and control of the particle size which, in turn, control the emitted wavelength when excited by optical or electrical signal. At the same time, the low plasma potential of the high density plasma technique minimizes any plasma induced bulk or interface damage, which is critical for the fabrication of high performance electronic devices.

FIG. 10 is a flowchart illustrating a method for solar cell light wavelength conversion. The method starts at Step 1000. Step 1002 provides a SiOxNyCz thin film, where x, y, z≥0, with a bandgap in the range of about 1.9 to 3 eV, embedded with semiconductor nanoparticles. The semiconductor material may be Si, Ge, or a combination of Si and Ge. Step 1002 also provides a solar cell underlying the SiOxNyCz thin film. The solar cell comprises a bottom electrode doped with either an n-type or p-type dopant, a long wavelength light absorbing layer overlying the bottom electrode, and a top electrode overlying the long wavelength light absorbing layer. If the bottom electrode is n-doped, the top electrode is p-doped. Alternately, if the bottom electrode is p-doped, the top electrode is n-doped.

Step 1004 exposes the SiOxNyCz thin film to incident light. In the SiOxNyCz thin film, Step 1006 absorbs short wavelengths of light, shorter than about 500 nm. In response to absorbing the light wavelengths, Step 1008 emits long wavelengths of light from the SiOxNyCz thin film, longer than about 500 nm. In Step 1010, the solar cell light long wavelength absorbing layer absorbs wavelengths of light longer than 500 nm.

Solar cells, wavelength conversion solar cells, and a corresponding SiOxNyCz thin film fabrication process have been provided. Some details of specific materials and fabrication steps have been used to illustrate the invention. However, the invention is not limited to merely these examples. Other variations and embodiments of the invention will occur to those skilled in the art.

We claim:

1. A method for forming a semiconductor nanocrystalline silicon insulating thin-film with a tunable bandgap, the method comprising:
   providing a substrate;
   introducing a silicon (Si) source gas and at least one source gas selected from a group consisting of germanium (Ge), oxygen, nitrogen, and carbon into a high density (HD) plasma-enhanced chemical vapor deposition (PECVD) process;
   depositing a SiOxNyCz thin-film embedded with a nanocrystalline semiconductor material overlying the substrate, where x, v, z≥0, and the semiconductor material is selected from a group consisting of Si, Ge, and a combination of Si and Ge;
   subsequent to depositing the SiOxNyCz thin-film, annealing the SiOxNyCz thin-film; and,
   modifying the size of the nanocrystalline semiconductor material in response to the annealing, forming a bandgap in the SiOxNyCz thin-film with a minimum value of 1.9 electron volts (eV) and a refractive index in a range of 1.9 to 3.5, as measured at a wavelength of 632 nanometers (nm).

2. The method of claim 1 wherein forming the bandgap in the SiOxNyCz thin film includes forming semiconductor nanoparticles having a size in a range of 1 to 20 nm.

3. The method of claim 2 wherein introducing the Si source gas into an HD PECVD process includes using an inductively coupled plasma (ICP) process as follows:
   supplying power to a top electrode at a frequency in the range of 13.56 to 300 megahertz (MHz), and a power density of up to 10 watts per square centimeter (W/cm$^2$);
   supplying power to a bottom electrode at a frequency in the range of 50 kilohertz to 13.56 MHz, and a power density of up to 3 W/cm$^2$; and,
   using an atmosphere pressure in the range of 1 to 500 mTorr.

4. The method of claim 3 wherein supplying the oxygen source gas includes supplying an oxygen source gas from a source selected from a group consisting of $N_2O$, NO, $O_2$, and $O_3$.

5. The method of claim 3 wherein supplying the nitrogen source gas includes supplying a nitrogen source gas selected from a group consisting of $N_2$ and $NH_3$.

6. The method of claim 3 wherein supplying the carbon source gas includes supplying a carbon source gas selected from a group consisting of alkanes ($C_nH_{2n+2}$), alkenes ($C_nH_{2n}$), alkynes ($C_nH_{2n-2}$), benzene ($C_6H_6$), and toluene ($C_7H_8$).

7. The method of claim 3 wherein supplying the Ge source gas includes supplying a Ge source gas selected from a group consisting of $Ge_nH_{2n+2}$, where n varies from 1 to 4, and $GeH_xR_{4-x}$ where R is selected from a group consisting of Cl, Br, and I, and where x varies from 0 to 3.

8. The method of claim 3 wherein introducing the Si source gas further includes supplying an inert gas selected from a group consisting of He, Ar, and Kr.

9. The method of claim 1 wherein forming the bandgap in the SiOxNyCz thin-film includes forming a SiOxNyCz thin-film with peak optical emission, transmission, and absorption characteristics at a wavelength in a range of 200 to 1600 nm.

10. The method of claim 1 wherein introducing the Si source gas includes supplying a source gas selected from a group consisting of SiH4, Si2H6, TEOS (tetra-ethoxy orthosilicate), $Si_nH2_{n+2}$, where n varies from 1 to 4, and $SiH_xR_{4-x}$ where R is selected from a first group consisting of Cl, Br, and I, and where x varies from 0 to 3.

11. The method of claim 1 further comprising:
   simultaneous with the HD PECVD process, heating the substrate to a temperature in a range of about 25 to 400° C.

12. The method of claim 1 wherein annealing the SiOxNyCz thin film includes:
   heating an underlying substrate to a temperature of greater than about 400° C.;
   heating for a time duration in the range of about 10 to 300 minutes; and,
   heating in an atmosphere selected from a group consisting of oxygen and hydrogen, oxygen, hydrogen, and inert gases.

13. The method of claim 12 wherein the annealing includes using a process selected from a group consisting of flash annealing and laser annealing using a heat source having a radiation wavelength selected from a group consisting of about 150 to 600 nanometers (nm) and 9 to 11 micrometers.

14. The method of claim 1 further comprising:
   performing a HD plasma treatment on the SiOxNyCz thin film in an $H_2$ atmosphere, using a substrate temperature of less than 400° C.; and,
   hydrogenating the SiOxNyCz thin film.

15. The method of claim 14 wherein hydrogenating the SiOxNyCz thin film using the HD plasma process includes:
   supplying power to a top electrode at a frequency in the range of 13.56 to 300 MHz, and a power density of up to 10 W/cm$^2$;
   supplying power to a bottom electrode at a frequency in the range of 50 kilohertz to 13.56 MHz, and a power density of up to 3 W/cm$^2$;
   using an atmosphere pressure in the range of 1 to 500 mTorr; and,
   supplying an atmosphere selected from a group consisting of $H_2$ and an inert gas, and $H_2$.

16. The method of claim 1 wherein forming the bandgap in the SiOxNyCz thin film includes forming a SiOxNyCz thin film selected from a group consisting of intrinsic and doped thin films.

17. The method of claim 16 wherein forming the doped SiOxNyCz thin film includes in-situ doping during the HD PECVD process using a source selected from a group consisting of a dopant source gas and a physical sputtering source.

18. The method of claim 1 wherein introducing the Si source gas into the HD PECVD process includes using an energy source selected from a group consisting of a microwave slot antenna, ICP, a hollow cathode, an electron cyclotron resonance (ECR) plasma source, and a cathode-coupled plasma source.

19. The method of claim 1 wherein providing the substrate includes providing a substrate from a material selected from a group consisting of plastic, glass, quartz, Si, SiC, GaN, Ge, and $Si_{1-x}Ge_x$.

20. The method of claim 1 wherein providing the substrate includes forming a bottom electrode doped with a material selected from a first group consisting of n-type and p-type dopants;
   wherein forming the bandgap in the SiOxNyCz thin film includes forming a SiOxNyCz thin film selected from a group consisting of a doped and intrinsic thin film; and,
   the method further comprising:
   forming a top electrode overlying the SiOxNyCz thin film doped with the unselected dopant from the first group.

21. The method of claim 20 wherein forming the top and bottom electrodes includes forming the top and bottom electrodes in-situ from the SiOxNyCz thin film.

22. A method for forming a semiconductor nanocrystalline silicon insulating thin-film with a tunable bandgap, the method comprising:
  providing a substrate;
  introducing a silicon (Si) source gas and at least one source gas selected from a group consisting of germanium (Ge), oxygen, nitrogen, and carbon into a high density (HD) plasma-enhanced chemical vapor deposition (PECVD) process;
  depositing a $SiO_xN_yC_z$ thin-film embedded with a nanocrystalline semiconductor material overlying the substrate, where x, y, z≥0, and the semiconductor material is selected from a group consisting of Si, Ge, and a combination of Si and Ge; and,
  forming a bandgap in the $SiO_xN_yC_z$ thin-film, with a minimum value of about 1.9 electron volts (eV) and a refractive index in a range of about 1.9 to 3.5, as measured at a wavelength of 632 nanometers (nm).

* * * * *